United States Patent
Dougherty et al.

(10) Patent No.: US 6,901,572 B1
(45) Date of Patent: May 31, 2005

(54) POWER SEQUENCE CONTROLLER PROGRAMMING TECHNIQUE

(75) Inventors: Paul R. Dougherty, Hillsboro, OR (US); Srirama Chandra, Beaverton, OR (US); Hans W. Klein, Danville, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 194 days.

(21) Appl. No.: 10/272,582

(22) Filed: Oct. 15, 2002

(51) Int. Cl.[7] .................. H03K 19/00; G06F 17/50; G06F 1/26
(52) U.S. Cl. .................. 716/17; 716/18; 713/300; 713/330
(58) Field of Search .................. 716/1–3, 17–18; 713/300, 310, 320–321, 330, 340

(56) References Cited

U.S. PATENT DOCUMENTS

| | | | | |
|---|---|---|---|---|
| 5,603,043 A | * | 2/1997 | Taylor et al. .................. | 712/1 |
| 6,438,738 B1 | * | 8/2002 | Elayda .................. | 716/16 |
| 6,490,714 B1 | * | 12/2002 | Kurniawan et al. .......... | 716/17 |
| 6,735,706 B2 | * | 5/2004 | Tomlinson et al. ......... | 713/300 |

OTHER PUBLICATIONS

*Summit Microelectronics, Inc. SMT4004, Quad Tracking Power Supply Manager*, Summit Microelectronics, Inc. 2001, pp. 1–35.
*Summit Microelectronics, Inc. SMT4214, Expandable Four-Rail Tracking Manager*, Summit Microelectronics, Inc. 2001, pp. 1–17.
*Analog Devices, Communications System Supervisory/Sequencing Circuit*, Analog Devices, Inc., 2002, pp. 1–45.

* cited by examiner

*Primary Examiner*—Leigh M. Garbowski
(74) *Attorney, Agent, or Firm*—MacPherson Kwok Chen & Heid LLP (57) ABSTRACT

A programming technique for a programmable logic device (PLD) is disclosed wherein the programmed PLD controls a circuit's behavior according to a desired circuit behavior implementation. A user constructs a program, wherein the program comprises instructions defining inputs, outputs, and conditional branching for an abstract state sequencer that implements the desired circuit behavior. The programming technique then translates the states and resources for the abstract state sequencer into HDL source code, which in turn may be translated into a programming bit pattern for the PLD.

20 Claims, 2 Drawing Sheets

POWER SEQUENCE CONTROLLER PROGRAMMING TECHNIQUE

TECHNICAL FIELD

This invention relates to power sequence control, and more particularly to a method of programming sequence controllers.

BACKGROUND

Modern electronics such as high-performance microprocessor and digital signal processor systems increasingly require a plurality of voltage levels. Care must be taken to power up and down the corresponding voltage rails. Internal circuits suffer stress if certain power rails are active while others are inactive. In addition, microprocessors may suffer latch-up, which damages or destroys affected transistors. As a result, power up and power down sequencing must be practiced to prevent these problems.

Power supply sequence controllers enable circuit designers to meet the need for power sequencing in their designs. A programmable sequence controller comprises a programmable logic device (PLD) that a user programs according to the particular power sequence control desired. An example programmable sequence controller is disclosed in U.S. patent application Ser. No. 09/732,216 entitled "Programmable Power Management System and Method," filed Dec. 6, 2000, which is hereby incorporated by reference in its entirety. Generally, programming a PLD involves writing a hardware-description-language-(HDL)-based source code. Although the use of HDL is widespread, writing HDL code is complicated and involves a substantial amount of overhead, even for the relatively simple designs involved in power sequence control. In addition, the configurability of the programmable logic in power sequence controllers substantially adds to the burden of writing the necessary HDL source code.

Accordingly, there is a need in the art for improved techniques to program power sequence controllers.

SUMMARY

In accordance with one aspect of the invention, a method of programming a programmable logic device (PLD) is provided, wherein the programmed PLD controls a circuit's behavior according to a desired circuit behavior implementation. The method includes an act of reading a program, wherein the program comprises instructions defining inputs, outputs, and conditional branching that implements the desired circuit behavior. The program is translated into an abstract state sequencer. The abstract state sequencer may then be translated into a hardware description language (HDL) source code as governed by the programmable architecture of the PLD. Finally, the HDL source code may be translated into a programming bit pattern that may be used to program the PLD.

The invention will be more fully understood upon consideration of the following detailed description, taken together with the accompanying drawings.

DETAILED DESCRIPTION

The present invention provides a programmable power sequence controller programming technique. Any programmable power sequence controller may benefit from the programming technique disclosed herein. For example, a programmable power sequence controller that may be programmed according to the present invention is set forth in U.S. patent application Ser. No. 09732,216 entitled "Programmable Power Management System and Method," filed Dec. 6, 2000. This power sequence controller includes a configurable AND array that supplies product terms to a plurality of configurable macrocells. By programming the AND array and the macrocells, a user can program this power sequence controller to control power supplies as desired.

Figure 1:
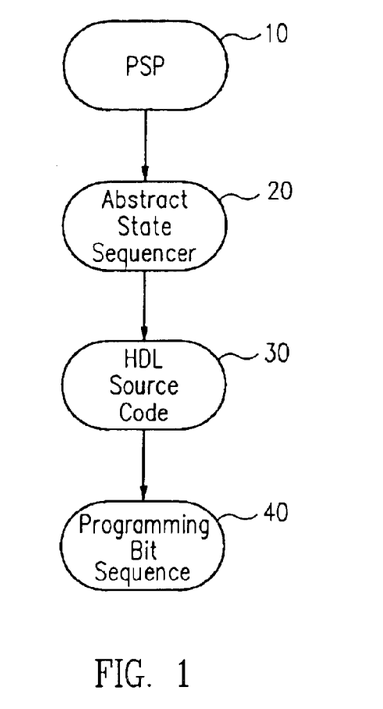
FIG. 1 is a high level flow chart for a PLD programming technique according to one embodiment of the invention.

Although described herein with respect to a power sequence controller, it will be appreciated that the present invention may be broadly applied to the programming of PLDs to control any desired circuit behavior. FIG. 1 is a high level flow chart of the PLD programming method disclosed herein that may be practiced, for example, by a computer program known as a software development tool. At step 10, the development tool reads a program provided by a user which describes a desired circuit behavior. This program is preferably like assembly language for a small microcontroller in that there is a one-to-one correspondence between program statements and circuit instruction operations.

The user-provided program is first translated into an abstract state sequencer program at step 20. Whereas the program constructed in step 10 is independent of the programmable architecture of the PLD being programmed, the abstract state sequencer program developed in state 20 should account for certain details of this architecture. Specifically, the translation of the program from step 10 depends upon the number of clocks per instruction and any pipelining necessary to meet program semantics (which in turn is affected by the number of clocks per instruction, the number of state variable flip-flops needed to meet program size, and resource allocation of I/O cells, which are either left fixed or left "unallocated" for downstream processing to place into hardware).

At step 30, the abstract state sequencer program developed in step 20 is translated into a hardware-description language (HDL) source code for the programmable architecture implemented in the particular PLD being programmed.

At step 40, the HDL source code is translated into the appropriate bit pattern to be programmed into the PLD. This bit pattern may then be downloaded into the PLD so as to complete the desired programming.

Figure 2:
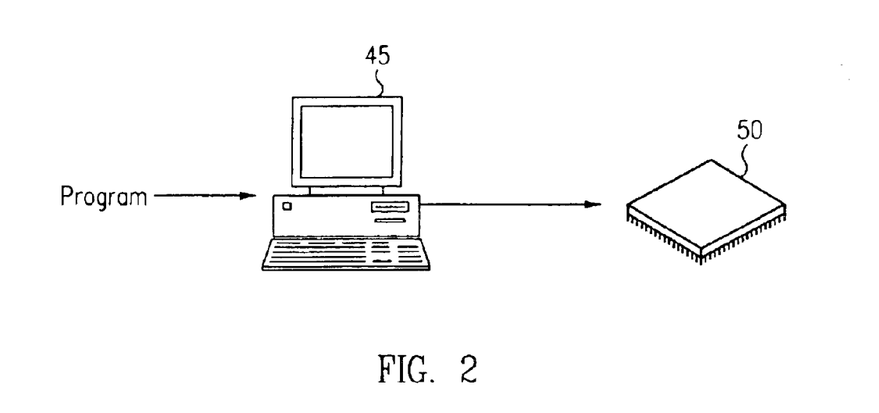
FIG. 2 is a high level illustration of the data flow for a PLD programming technique according to one embodiment of the invention.

The software required to perform the PLD programming technique of the present invention may be programmed into a Windows®-based PC such as PC 45 of FIG. 2 using a suitable programming language such as C. As shown graphically in FIG. 2, a user enters a program that describes a desired circuit behavior (corresponding to step 10 of FIG. 1) into the programmed PC 45. Following the steps described in FIG. 1, PC 45 generates the appropriate bit sequence to program a PLD 50. After receiving this bit sequence, PLD 50 is programmed and ready to control the desired circuit behavior as desired by a user.

Figure 3:
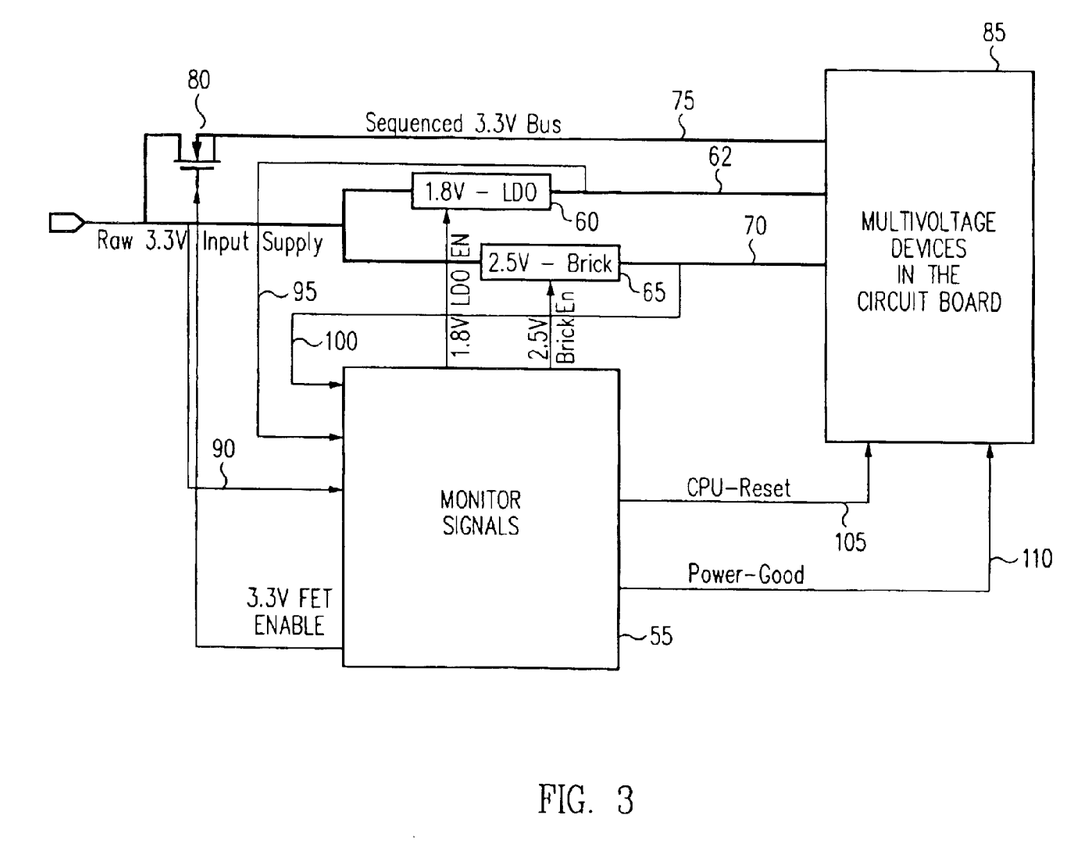
FIG. 3 is a block diagram of a multi-voltage device coupled to a plurality of power converters and a FET-controlled sequenced voltage rail, wherein the plurality of power converters and the FET-controlled sequenced voltage rail are controlled by a programmable power sequence controller.

Keeping in mind these general features, a specific embodiment of the PLD programming technique specialized to program a power sequence controller will now be described. Turning now to FIG. 3, a power sequence controller 55 controls a 1.8V DC-DC power converter 60 powering a 1.8V rail 62 and a 2.5v DC—DC power converter 65 powering a 2.5v rail 70. In addition to these rails, a 3.3v sequenced rail 75 couples to a 3.3v supply voltage through FET 80. Each power converter receives the 3.3v supply voltage. A multivoltage device 85 receives the rails 75, 62, and 70. Power sequence controller 55 controls these rails through binary enable signals 3.3v Fet Enable, 1.8V LDO En, and 2.5V Brick En, respectively (these enable signals may also be denoted as "turn on" signals). Power sequence controller 55 monitors the analog voltage on rails 75, 62, and 70 via monitor signals 90, 95, and 100, respectively. Internally, power sequence controller 55 may compare the monitor signals to thresholds and generate binary variables (that may be denoted as VMONX, where X indicates the index of the monitored rail) indicating whether a given monitor signal is within an operating tolerance. In addition, power sequence controller 55 outputs binary control signals to multivoltage device 85, e.g., a CPU-reset signal 105 and a power-good signal 110.

Power sequence controller 55 contains programmable logic in the form of a configurable AND array providing product terms to a plurality of configurable macrocells that a user must configure or program to effect a desired power control sequence using one or more of a plurality of internal timers. To begin programming according to the present invention, a user writes a power supply program having a plurality of steps by choosing instructions from a sequence controller instruction set. The goal of the power supply program is to define the necessary sequences for the turning on of power supplies, the maintenance of normal operation until the power switch is turned off, and the necessary sequences for the turning off of the power supplies. In certain embodiments of the programming method, only one operation type per step in the power supply program may be permitted so as to simplify the translation of the program. Similarly, with the exception of outputs, only one operation per step in the program may be implemented in other embodiments.

To satisfy the goals of the power supply program, the sequence controller instruction set may includes statements that: 1) wait for a Boolean condition, 2) wait for an elapsed time using a specified timer, 3)turn on/turn off one or more outputs, 4) reset the power sequence controller, and 5) branch to another step in the sequence. The following statements form a suitable example instruction set.

WaitFor a <Boolean-Expression>

This instruction will command the power sequence controller to wait for the Boolean expression to be true and then implicitly transition to the next step in the power supply program. The Boolean expression is typically an AND of a few input signals.

Output Instructions (denoted by keywords Turn on <output signal>, Turn off <output signal>, Assert <output signal>, Release <output signal>, StartTimer, and ResetTimer):

These instructions turn on or off power sequence controller outputs. For example, to turn on a 1.5 voltage rail, the power supply program includes an instruction "Turn on 1.5v." Note that the different keywords accommodate power supplies vs. resets. The "assert" instruction will make the corresponding output signal be "true" (whether this is positive high or positive low). The "release" instruction will make the corresponding output signal "false" (again, whether this is positive high or positive low).

IF <Boolean Expression> THEN <ThenStep> ELSE <ElseStep>

This instruction allows two-way branches in the power supply program. The Boolean expression is typically an AND of a few input signals. When this Boolean expression is true, the program will branch to the program step number specified by the variable "ThenStep." If the Boolean expression is false, the program will branch to the program step number specified by the variable "ElseStep." In other embodiments of the program instruction set, more elaborate multi-way branching may be supported, at the cost of additional user-interface complexity.

Wait for <timeout value> usingTimer <number>

This instruction commands the power sequence controller to wait for a time to elapse that is specified in real time using the specified timer. After the specified time elapses, the power supply program will implicitly go to the next step. For increased simplicity in certain embodiments, only one timer (out of the plurality available to a given power sequence controller) may be used with any given power supply program instruction.

GoTo <Gotostep>

This instruction commands the power sequence controller to branch to the program step specified by the value of the variable "Gotostep."

Halt

This instruction commands the power sequence controller to stop the execution of the power supply program. Unlike some microprocessor "halt" commands, the power sequence controller will not power down in any way in response to the halt instruction. However, as will be explained further herein, the power supply program may include an "exception" table that enables the power supply controller to immediately go to a specified state if a Boolean expression is true. An exception would free the power sequence controller from an executed halt instruction because the power sequence controller would transition to the state specified in the exception.

Nop

This instruction commands the power sequence controller to perform no other operation other than jumping to the next step in the program. Accordingly, it amounts to a one clock delay (assuming that the programmable architecture in the power sequence controller corresponds to one clock per instruction).

In addition to performing according to the instruction set, a power sequence controller should be able to accommodate emergencies such as an overvoltage condition. If the power supply program were running on a microprocessor, an interrupt could be generated in response to the emergency. However, the PLD "brain" of a power sequence controller has no return stack and thus interrupts are not applicable. Instead, the power sequence controller may have "exceptions" from which it cannot return. These exceptions allow a vectoring capability. For example, if a Boolean expression is satisfied, one or more asynchronous resets of the state machine resulting from the power supply program may be made (depending upon hardware limitations), unlimited numbers of synchronous jumps to specified states may be accomplished, and asynchronous outputs may be included.

The Boolean expressions can include power sequence controller inputs, outputs, and state variables expressed as a state (note that individual state registers flip-flops should not be assigned because the translator (to HDL) must be free to reassign them at any time).

To implement these exceptions, a user would include an "exception table" with the power supply program. An example exception table would be:

| Condition | Output (2 forms) | If TRUE, Goto Destination | Comment |
|---|---|---|---|
| Boolean expression of inputs to PLD array | PLD Output (pin name) = <constant> PLD Output (pin name) = <boolean expression> | State number or state name | |

In the latter form of the asynchronous outputs, combinatorial outputs will follow inputs after a propagation delay. The jump to the state specified by the variable "destination" may be asynchronous (if performing a reset) or synchronous (if jumping to any numbered or named state besides reset). Note that the Boolean expression is a property of the instruction, not a run-time property of the state machine itself (as it would be for a typical interrupt-enable flag). Thus, a user benefits from the affect of interrupts in the system without the overhead of a flip-flop to record the enabled state of interrupts at run-time.

Keeping in mind the above-described features of the power supply instruction set and the exception table, an example power supply program may be shown. In this sample, a user desires to wait until the 5 volt rail and the 2.5 volt rail are above the undervoltage threshold. When these rails are above the undervoltage threshold, the 1.5v, 1.8v, and 2.5v rails are brought up in sequence, with a 1 millisecond delay between turn on. After an additional 1 millisecond delay, both 3.3v rails are turned on. A suitable power supply program would be:

| Step 1 | WaitFor 5 v Under & 2.5 v Under |
| Step 2 | Turn on 1.5 v |
| Step 3 | Wait 1 ms |
| Step 4 | Turn on 1.8 v |
| Step 5 | Wait 1 ms |
| Step 6 | Turn on 2.5 v |
| Step 7 | Wait 1 ms |
| Step 8 | Turn on 3.3 v 1, Turn on 3.3 v 2 |

Once a user has written a power supply program, a platform such as CPU 45 programmed to implement the method of the present invention may translate the power supply program into HDL source code. Any suitable HDL may be used, e.g., ABEL or VHDL. The following example will use ABEL although the details would be analogous if another HDL were used. The translation into ABEL occurs in two steps. In a first step, an ABEL state is created for every power supply program step (assuming that the programmable architecture in the power sequence controller uses 1 clock cycle per instruction, otherwise create multiple ABEL states per instruction, one per clock). In a second step, every power supply program step is examined and each affected ABEL state has an item compiled. For example, consider a 14 step power supply program (PSP) corresponding to a 14 state ABEL program. The following nested loop will execute a possible 14*14 or 196 compilation operations.

```
Outer loop: PSP instructions (14)
   Reserve resources used by this instruction (timers)
   Inner loop: ABEL states (14)
      Build "state" based on position relative to currentState and
      type of instruction being compiled.
   End-inner-loop
End Outer loop (PSP instructions)
```

During this nested loop, there is a "current instruction" and a "current state" defined by the loop variables. Most compilation actions occur from the "current instruction" to the "current state." However, the translation is from logical to physical, so the other states may be useful.

When compiling a single instruction that has several actions (which implies multiple clock cycles) into a target state machine that allows only one instruction per clock cycle, pipelining is required. Typically, one to two states (corresponding to one to two clock cycles) before or after the current state can be affected. This may be demonstrated using the WaitFor Timer instruction as follows: Suppose a user wants to clear a Start_timer signal, set the Start_timer signal, wait for another (output) signal to become true and then end the instruction with a "goto next state" operation into a one-clock-per-state state machine. Because ABEL supports the WHILE clause, the Start_timer signal can be reset upon exiting the current state(corresponding to the nth state) as follows:

| State | Action |
|---|---|
| State N−1 | Clear Start_timer signal |
| State N | Set Start_timer signal, wait for timer to complete, clear Start_timer signal, goto next state |

If, however, a user had to clear the timer in the state following the "current state," another state would be necessary as follows:

| State | Action |
|---|---|
| State N−1 | Clear Start_timer signal |
| State N | Set Start_timer signal, wait for timer to complete, goto next state. |
| State N+1 | clear Start_timer signal. |

It will be appreciated that the above examples may be extended to state machines having multiple clock cycles per instruction.

The exception table is compiled in parallel during the second stage of the power supply program compilation or it may be compiled separately. During compilation of the power supply program into HDL source code, the instructions subject to the exceptions should be identified. Although "exception test code" could be inserted for each instruction individually to identify whether a given instruction is subject to an exception, compile-time flags ("pragmas") may also be used. The pragma is effective for the duration of the compilation, which means that all states after the current state (identified by the pragma) can be affected. As an example of pragmas, "no-operation" instructions may be inserted into the power supply program to identify which instructions are subject to exceptions. For example, instructions arbitrarily denoted as "BeginStartup" and "BeginShutdown" could divide a power supply program into two phases: a "startup" phase that can be interrupted by exceptions, and a "shutdown" phase that cannot be interrupted by exceptions. As such, the BeginStartup and BeginShutdown instructions do nothing but act as placeholders to turn the "compile exception test code" compile-time flag (pragma) on and off.

It will be appreciated that implementation issues should be considered when deciding whether to use such compile-time flags. For example, in the programmable power controller 55 of FIG. 3, the number of macrocells available for programming may be quite small (e.g., 8). However, the "BeginStartup" and "BeginShutdown" compile to "code" that takes up to a state each. As such, if programming capability is limited, true pragmas should be used instead because they would have no run-time effect.

The following example indicates how an ABEL state would be altered in light of a user-specified exception. Note that a Boolean test can be attached to any power supply program instruction, and if the test succeeds, a branch is taken to the selected state. For example, standard OUTPUT instruction may be coded as follows (an ABEL state number 7 was chosen arbitrarily):

```
State 7:
    HVOUT3.J = 0: ᵃreset HVOUT3
    HVOUT3.K = 1;
    Goto 8;
```

Attaching an "If VMON1 Then Goto 12" exception condition to this OUTPUT instruction is coded like this in ABEL (where VMON1 is an arbitrary binary variable representing a true/false condition such as whether a monitored output voltage is within a specified range):

```
State 7:
    HVOUT3.J = 0 ; * reset HVOUT3
    HVOUT3.K = 1 ;
    If VMON1 Then 12 * Exception IfThen
    Else
    Goto 8;
```

In general form, the following was added to the instruction:

```
If <boolean_expression> Then <state> * Exception handler
Else
```

It will be appreciated that multiple exceptions just add more conditions as follows:

```
If <boolean_expression1> Then <state1> * Exception handler1
Else
If <boolean_expression2> Then <state2> * Exception handler2
Else
```

Note that a Goto <state> ("Goto 8" in the sample) instruction is pasted at the end, after all the exceptions are taken care of.

After the first step of the two-step compilation, the sources and states of an abstract state sequencer are defined. However, a user may have inserted a power supply program instruction that introduces a logical error. For example, a "Goto step 25" instruction in a program having no such step 25. The abstract state sequencer may be analyzed before compilation in the second step to identify any logical errors. This analysis would shield a user from having to read through a relatively complicated HDL compilation error log.

As a result of the two-step compilation, the translation of the power supply program instruction set and exceptions into ABEL source code for a one-clock-per-instruction state machine is as follows:

ABEL source code generated for instruction WaitFor:

| ABEL code section | Generated ABEL code |
|---|---|
| Declaration block: | nothing generated |
| Clock definitions | nothing generated |
| Previous state | nothing generated |
| Current state | If <BooleanExpressionInABELFormat> Then <nextStateNumber> Else <currentStateNumber>; |
| Typical Result: | State <currentStateNumber>: If <BooleanExpressionInABELFormat> Then <nextStateNumber> Else <currentStateNumber>; |

ABEL source code generated for IF/THEN/ELSE instruction:

| ABEL code section | ABEL code generated by PAC-Designer |
|---|---|
| Declaration block: | nothing generated |
| Clock definitions | nothing generated |
| Previous state | nothing generated |
| Current state | If <BooleanExpressionInABELFormat> Then <ThenStateNumber> Else <ElseStateNumber>; |
| Typical Result: | State 1: If <BooleanExpressionInABELFormat> Then <nextStateNumber> Else <currentStateNumber>; |

ABEL source code generated for Output instructions:

| ABEL code section | Generated ABEL code |
|---|---|
| Declaration block: | Outputs are marked as "registered", like this OUT5 pin 28 istype 'reg_JK'; |
| Clock definitions | Outputs are marked as "clocked", like this OUT1.clk = PLD_CLK; |
| Previous state | nothing generated |
| Current state | <output_name_N.J = <BooleanExpressionInABELFormat>; <output_name_N.K = !<BooleanExpressionInABELFormat>; as many as 16 lines, two lines per output. |
| Typical Result: | State <currentStateNumber>: OUT5.J = 1; OUT5.K = 0; OUT7 = VMON1; |

ABEL source code generated for Wait for <timeout value> instruction:

| ABEL code section | Generated ABEL code |
|---|---|
| Declaration block: | Outputs are listed like this: TIMER1_TC pin 27 ; |
| Clock definitions | Outputs are marked as "clocked", like this TIMER1_TC.clk = PLD_CLK; |
| Previous state | TIMER1_GATE = 0 ; (clear/reset timer) |
| Current state | TIMER<n>_GATE = 1 ; " enable timer <n> If TIMER<n>TC Then <nextStateNumber> With TIMER<n>_GATE=0 Else <currentStateNumber> With TIMER<n>_GATE=1; |
| Typical Result: | State 3: TIMER1_GATE = 1 ; " enable timer 1 If TIMER1_TC Then 4 With TIMER1_GATE=0 Else 3 With TIMER1_GATE=1; |

ABEL source code generated for the Goto instruction

| ABEL code section | Generated ABEL code |
|---|---|
| Declaration block: | nothing generated |
| Clock definitions | nothing generated |
| Previous state | nothing generated |
| Current state | State N: Goto <N+1>; |
| Typical Result: | State 1: Goto 2; |

ABEL source code generated for the Halt instruction

| ABEL code section | Generated ABEL code |
|---|---|
| Declaration block: | nothing generated |
| Clock definitions | nothing generated |
| Previous state | nothing generated |
| Current state | State N: Goto <N>; |
| Typical Result: | State 1: Goto 1; |

ABEL source code generated for the Nop instruction

| ABEL code section | ABEL code generated by PAC-Designer |
|---|---|
| Declaration block: | nothing generated |
| Clock definitions | nothing generated |
| Previous state | nothing generated |
| Current state | State N: Goto <N+1>; |
| Typical Result: | State 1: Goto 2; |

ABEL source code generated for an exception:

| ABEL code section | Generated ABEL code |
|---|---|
| Declaration block: | nothing generated |
| Clock definitions | Outputs not used by an instruction are marked as "clocked", like this OUT1.clk = PLD_CLK; |
| Equations block | Each equation is placed here |
| Disabled states | nothing generated |
| Enabled states | <output_name_N.J = <BooleanExpressionInABELFormat>; <output_name_N.K = !<BooleanExpressionInABELFormat>; as many as 16 lines, two lines per output. |
| Typical Result: | State <currentStateNumber>: OUT5.J = 1; OUT5.K = 0; OUT7 = VMON1; |

Note that exceptions are a combination of "interrupt logic" and combinatorial glue logic" that a user may control. In contrast to those resulting from power supply program instructions, non-registered outputs are available.

Referring back to FIG. 3, the following example power supply program for power sequence controller 55 demonstrates the advantages the present invention provides with respect to traditional HDL programming techniques. Suppose a user wants to wait until the 3.3v supply voltage is above its undervoltage threshold and then enable the 1.8V DC-DC power converter 60 to power up the 1.8v rail 62. After a wait of 16.384 ms, the user wants to wait for the voltage on 1.8v rail 62 to be above its undervoltage threshold and then enable the 2.5v DC—DC power converter 65 to power up the 2.5v rail 70. After the voltage on the 2.5v rail 70 is above its undervoltage threshold, FET 80 should be switched on and the power_good signal 10 asserted. Then, after a wait of 4.096 ms, CPU_reset signal 105 should be asserted. During shutdown, all enable signals should be released simultaneously. The following power supply program accomplishes these objectives:

| | |
|---|---|
| Step 0 | Begin Startup Sequence (ispPAC50 reset) |
| Step 1 | Raw3V3_FET_En = 0, Brick2V5_En = 0, LDO1V8_En = 0, Power_Good = 0, CPU_Reset = 0, |
| Step 2 | Wait For Raw3V3_Under |
| Step 3 | LDO1V8_En = 1 |
| Step 4 | Wait for 16.384 ms using timer 1 |
| Step 5 | Wait for LDO1V8_Under |
| Step 6 | Brick2V5_En = 1 |
| Step 7 | Wait for Brick2V5_Under |
| Step 8 | Raw3V3_Fet_En = 1, Power_Good = 1, |
| Step 9 | Wait for 4.096 ms using timer 2 |
| Step 10 | CPU_Reset = 1 |
| Step 11 | Halt |
| Step 12 | Begin Shutdown Sequence |
| Step 13 | Raw3V3_FET_En = 0, Brick2V5_En = 0, LDO1V8_En = 0, Power_Good = 0, CPU_Reset = 0 |
| <end of program> | |

After processing by the programming technique discussed above, the equivalent ABEL source code is as follows:

```
Module PSCProgram
" Target_system: ispPAC50
library 'lattice';
" Start of pin definitions
    Raw3v3_Under pin 11 ;
    Brick2V5_Under pin 12 ;
    LDO1V8_Under pin 13 ;
    VMON4 pin 14 ;
    VMON5 pin 15 ;
    VMON6 pin 16 ;
    VMON7 pin 17 ;
    VMON8 pin 18 ;
```

-continued

```
        VMON9 pin 19 ;
        VMON10 pin 20 ;
        VMON11 pin 21 ;
        VMON12 pin 22 ;
        IN1 pin 23 ;
        IN2 pin 24 ;
        IN3 pin 25 ;
        IN4 pin 26 ;
        TIMER1_TC pin 27 ;
        TIMER2_TC pin 28 ;
        TIMER3_TC pin 29 ;
        TIMER4_TC pin 30 ;
        Raw3V3_FET_En pin 1    istype 'reg_JK' ;
        Brick2V5_En pin 2    istype 'reg_JK' ;
        LDO1V8_En pin 3 istype 'reg_JK' ;
        HVOUT4 pin 4    istype 'reg_JK' ;
        Power_Good pin 5    istype 'reg_JK' ;
        CPU_Reset pin 6    istype 'reg_JK' ;
        OUT7 pin 7    istype 'reg_JK' ;
        OUT8 pin 8    istype 'reg_JK' ;
        TIMER1_GATE node    istype 'reg' ;
        TIMER2_GATE node    istype 'reg' ;
        TIMER3_GATE node    istype 'reg' ;
        TIMER4_GATE node    istype 'reg' ;
        STATE_FF3 node    istype 'reg' ;
        STATE_FF2 node    istype 'reg' ;
        STATE_FF1 node    istype 'reg' ;
        STATE_FF0 node    istype 'reg' ;
" end of pin definitions
CLK_IN pin 9;
TMR_clk    node;
PLD_clk    node;
RESET pin 10;
" PRESCALER Declaration with attributes:
" XLAT_PRESCALER(TMR_clk, PLD_clk, clk_250K, RST,
TMR_factor, PLD_factor)
XLAT_PRESCALER(TMR_clk, PLD_clk, CLK_IN, RESET, 512,
128) ;
XLAT_STIMER(TIMER1_TC, TIMER1_GATE, TMR_clk, RESET,
16.384) ;
XLAT_STIMER(TIMER2_TC, TIMER2_GATE, TMR_clk, RESET,
4.096) ;
equations
" Start of clock assignments
        Raw3V3_FET_En.clk = PLD_clk;
        Brick2V5_En.clk = PLD_clk;
        LDO1V8_En.clk = PLD_clk;
        Power_Good.clk = PLD_clk;
        CPU_Reset.clk = PLD_clk;
        TIMER1_GATE.clk = PLD_clk;
        TIMER2_GATE.clk = PLD_clk;
        STATE_FF3.clk = PLD_clk;
        STATE_FF2.clk = PLD_clk;
        STATE_FF1.clk = PLD_clk;
        STATE_FF0.clk = PLD_clk;
" end of clock assignments
" PRESCALER Instantiation:
PRE_SCALE PRESCALER(TMR_clk, PLD_clk, CLK_IN, !RESET) ;
TIMER_1 STIMER(TIMER1_TC, TIMER1_GATE, TMR_clk,
!RESET) ;
TIMER_2 STIMER(TIMER2_TC, TIMER2_GATE, TMR_clk,
!RESET) ;
" Start of exception table equations
" End of exception table equations
state_diagram [STATE_FF3, STATE_FF2, STATE_FF1,
STATE_FF0]
State 0:
        If Power_Good & ! Raw3v3_Under # Power_Good &
        ! Brick2V5_Under # Power_Good & ! LDO1V8_Under
        Then 13 " Exception IfThen
        Else
        Goto 1;
State 1:
        Raw3V3_FET_En.J = 0 ; " reset Raw3V3_FET_En
        Raw3V3_FET_En.K = 1 ;
        Brick2V5_En.J = 0 ; " reset Brick2V5_En
        Brick2V5_En.K = 1 ;
        LDO1V8_En.J = 0 ; " reset LDO1V8_En
        LDO1V8_En.K = 1 ;
        Power_Good.J = 0 ; " reset Power_Good
        Power_Good.K = 1 ;
        CPU_Reset.J = 0 ; " reset CPU_Reset
        CPU_Reset.K = 1 ;
        If Power_Good & ! Raw3v3_Under # Power_Good &
        ! Brick2V5_Under # Power_Good & ! LDO1V8_Under
        Then 13    " Exception IfThen
        Else
        Goto 2;
State 2:
        If Power_Good & ! Raw3v3_Under # Power_Good &
        ! Brick2V5_Under # Power_Good & ! LDO1V8_Under
        Then 13 " Exception IfThen
        Else
        If Raw3v3_Under Then 3
        Else 2;
State 3:
        TIMER1_GATE = 0 ; " stop/clear timer 1
        LDO1V8_En.J = 1 ; " set LDO1V8_En
        LDO1V8_En.K = 0 ;
        If Power_Good & ! Raw3v3_Under # Power_Good &
        Brick2VS_Under # Power_Good & ! LDO1V8_Under
        Then 13 " Exception IfThen
        Else
        Goto 4;
State 4:
" Wait for timer 1:
        TIMER1_GATE = 1 ; " enable timer 1
        If Power_Good & ! Raw3v3_Under # Power_Good &
        ! Brick2V5_Under # Power_Good & ! LDO1V8_Under
        Then 13 " Exception IfThen
        Else
        If TIMER1_TC Then 5 With TIMER1_GATE = 0
        Else 4 With TIMER1_GATE=1;
State 5:
        If Power_Good & ! Raw3v3_Under # Power_Good &
        Brick2V5_Under # Power_Good & ! LDO1V8_Under
        Then 13 " Exception IfThen
        Else
        If LDOTV8_Under Then 6
        Else 5;
State 6:
        Brick2V5_En.J = 1 ; " set Brick2V5_En
        Brick2V5_En.K = 0 ;
        If Power_Good & ! Raw3v3_Under # Power_Good &
        Brick2VS_Under # Power_Good & ! LDO1V8_Under
        Then 13 " Exception IfThen
        Else
        Goto 7;
State 7:
        If Power_Good & ! Raw3v3_Under # Power_Good &
        Brick2V5_Under # Power_Good & ! LDO1V8_Under
        Then 13 " Exception IfThen
        Else
        If Brick2VS_Under Then 8
        Else 7;
State 8:
        TIMER2_GATE = 0 ; " stop/clear timer 2
        Raw3V3_FET_En.J = 1 ; " set Raw3V3_FET_En
        Raw3V3_FET_En.K = 0 ;
        Power_Good.J = 1 ; " set Power_Good
        Power_Good.K = 0 ;
        If Power_Good & ! Raw3v3_Under # Power_Good &
        Brick2V5_Under # Power_Good & ! LDO1V8_Under
        Then 13 " Exception IfThen
        Else
        Goto 9;
State 9:
" Wait for timer 2:
        TIMER2_GATE = 1 ; " enable timer 2
        If Power_Good & ! Raw3v3_Under # Power_Good &
        Brick2V5_Under # Power_Good & ! LDO1V8_Under
        Then 13 Exception IfThen
        Else
        If TIMER2_TC Then 10 With TIMER2_GATE=0
        Else 9 With TIME___GATE=1;
State 10:
        CPU_Reset.J = 1 ; " set CPU_Reset
        CPU_Reset.K = 0 ;
```

```
            If Power_Good & ! Raw3v3_Under # Power_Good &
            Brick2V5_Under # Power_Good & ! LDO1V8_Under
            Then 13 " Exception IfThen
            Else
            Goto 11;
State 11:
            If Power_Good & ! Raw3v3_Under # Power_Good &
            Brick2V5_Under # Power_Good & ! LDO1V8_Under
            Then 13 " Exception IfThen
            Else
            Goto 11;
State 12:
" Begin Shutdown sequence.
" All Exceptions branch here, but exceptions are
disabled.
            Goto 13;
State 13:
            Raw3V3_FET_En.J = 0 ; " reset Raw3V3_FET_En
            Raw3V3_FET_En.K = 1 ;
            Brick2V5_En.J = 0 ; " reset Brick2V5_En
            Brick2V5_En.K = 1 ;
            LDO1V8_En.J = 0 ; " reset LDO1V8_En
            LDO1V8_En.K = 1 ;
            Power_Good.J = 0 ; " reset Power_Good
            Power_Good.K = 1 ;
            CPU_Reset.J = 0 ; " reset CPU_Reset
            CPU_Reset.K = 1 ;
            Goto 14;
State 14:
            Goto 14;
END
```

A comparison of the relative complexity between the power supply program and the resulting ABEL source code demonstrates the usefulness of the disclosed PLD programming technique. Not only is the power supply program substantially less complex, it is also much easier to understand and modify.

It will be appreciated that although the programming technique of the present invention has been described with respect to a programmable power sequence controller, this technique is widely applicable to the programming of any PLD. It will also be appreciated that the number of translations performed to produce the desired HDL code may be varied and that translations may be direct or indirect without departing from the principles of the invention. Accordingly, although the invention has been described with respect to particular embodiments, this description is only an example of the invention's application and should not be taken as a limitation. Consequently, the scope of the invention is set forth in the following claims.

We claim:

1. A method of programming a programmable logic device (PLD), wherein the PLD controls a circuit's behavior according to a desired circuit behavior implementation, comprising:

(a) reading a program, wherein the program comprises instructions defining inputs, outputs, and conditional branching that implement the desired circuit behavior;

(b) translating the program into an abstract state sequencer;

(c) translating the abstract state sequencer into hardware description language (HDL) source code as governed by the programmable architecture of the PLD; and (d) translating the HDL source code into a programming bit pattern used to program the PLD.

2. The method of claim 1, wherein the PLD comprises a power sequence controller and wherein the program in act (a) comprises a power supply program that describes the desired power sequence behavior.

3. The method of claim 2, wherein the abstract state sequencer of act (b) is a one-clock-cycle-per-instruction state sequencer and includes an individual state for each power supply program instruction.

4. The method of claim 2, wherein the abstract state sequencer of act (b) is a multiple-clock-cycle-per-instruction state sequencer and includes an individual state for each clock cycle per power supply program instruction.

5. The method of claim 2, wherein the HDL source code formed in act (c) is ABEL source code.

6. The method of claim 2, wherein the HDL source code formed in act (c) is VHDL source code.

7. The method of claim 2, further comprising:

identifying states created in act (b) that will be subject to an exception, wherein the exception defines a Boolean expression such that if the Boolean expression is satisfied, the abstract state sequencer will synchronously go to a specified state.

8. The method of claim 7, wherein the exception also defines a Boolean expression such that if the Boolean expression is satisfied, the abstract state sequencer is asynchronously reset.

9. The method of claim 1, further comprising:

programming the PLD with the programming bit pattern.

10. A computer readable medium on which is stored a computer program for executing the method of claim 1.

11. A method of programming a programmable power sequence controller, comprising:

reading a power supply program, wherein the program comprises instructions defining desired controller behavior in terms of inputs, outputs, and conditional branching;

translating the instructions of the power supply program into hardware description language (HDL) code; and translating the HDL code into a programming bit pattern used to program the power sequence controller.

12. The method of claim 11, wherein an abstract state machine defined by the power supply program instructions includes one or more clock cycles per instruction.

13. The method of claim 11, wherein the power supply program instructions include instructions from an instruction set that includes one or more of the following member instruction formats:

WaitFor a <Boolean expression>;

Turn on <output signal>;

Turn off <output signal>;

Assert (output signal);

Release (output signal);

If (<Boolean expression> THEN <ThenStep> Else <ElseStep>;

Wait for (timeout value) using Timer <number>;

GoTo <Gotostep>;

Halt; or

Nop.

14. The method of claim 13, wherein the instruction set includes all of the member instruction formats.

15. The method of claim 11, wherein the HDL source code is ABEL source code.

16. The method of claim 11, wherein the HDL source code is VHDL source code.

17. The method of claim 11, wherein the act of translating the instructions of the power supply program into hardware description language (HDL) code comprises:

translating the program instructions into an intermediate set of instructions that takes into account the number of clock cycles of the program instruction being translated; and translating the intermediate set of instructions into HDL code.

18. The method of claim 11, including programming the programmable power sequence controller with the programming bit pattern.

19. A computer readable medium on which is stored a computer program for executing the following instructions for programming a programmable power sequence controller:

reading a power supply program, wherein the program comprises instructions defining desired controller behavior in terms of inputs, outputs, and conditional branching;

translating the instructions of the power supply program into hardware description language (HDL) code; and translating the HDL code into a programming bit pattern used to program the power sequence controller.

20. The computer readable medium of claim 19, wherein the computer program includes instructions for programming the programmable power sequence controller with the programming bit pattern.

* * * * *